Aug. 29, 1967 H. R. CAMENZIND 3,339,155
TRANSISTOR SAWTOOTH GENERATOR CIRCUIT
Filed Jan. 14, 1966
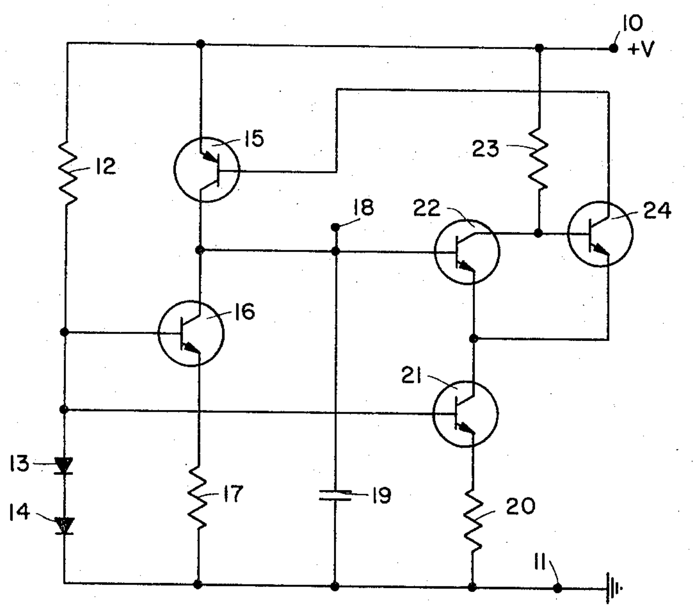
INVENTOR
HANS R. CAMENZIND
BY [signature]
ATTORNEY 3,339,155
TRANSISTOR SAWTOOTH GENERATOR CIRCUIT
Hans R. Camenzind, Lexington, Mass., assignor to P. R. Mallory & Co. Inc., Indianapolis, Ind., a corporation of Delaware
Filed Jan. 14, 1966, Ser. No. 520,567
7 Claims. (Cl. 331—111)

ABSTRACT OF THE DISCLOSURE

A sawtooth generator having a precise output waveform wherein a capacitor is accurately charged to the potential of a supply voltage and a Schmitt trigger circuit determines the discharge level of the capacitor. The sawtooth generator circuit utilizes the capacitance multiplication effect thereby reducing the physical size of the required capacitor.

The present invention relates to sawtooth generator circuits and more particularly to the means and methods for providing an improved sawtooth generator circuit that can be manufactured with integrated circuit techniques.

In some types of two-state amplifiers a generator is required for producing a sawtooth waveform of high linearity. If this amplifier is to be manufactured in integrated circuit form, the generator must have small total capacitance and resistance and should work well with large tolerances on all components used. Also, the output waveform of the generator must have a fixed and precise reference level.

Accordingly there is presented in this specification a sawtooth generator having an output waveform of fixed and precise reference level and which can be readily manufactured by integrated circuit techniques.

The sawtooth generator of the present invention incorporates a capacitance multiplication effect for reducing the actual size of the capacitor used. The capacitor is discharged through a constant current discharging means and recharged when a transistor is turned on by a Schmitt trigger circuit. The transistor which recharges the capacitor has its emitter-collector circuit connected between the voltage source for the generator and the capacitor. Therefore, the capacitor is always accurately charged to the level of the voltage source. The Schmitt trigger is connected in circuit with a constant current network for accurately determining when the Schmitt trigger will operate as the capacitor discharges. Therefore, the capacitor is always discharged to the same level. The charged level and discharged level of the capacitor are, respectively, the upper and lower levels of the output waveform.

It is an object of the present invention, therefore, to provide a sawtooth generator having a precise output waveform which can be manufactured by integrated circuit techniques.

It is another object of the present invention to provide a sawtooth generator circuit wherein a capacitor is accurately charged to the potential of a supply voltage and a Schmitt trigger circuit determines the discharged level of said capacitor.

It is another object of the present invention to provide a sawtooth generator circuit having a constant current discharging means for a capacitor of said generator.

It is still another object of the present invention to provide a sawtooth generator circuit which utilizes a capacitance multiplication effect, thereby reducing the physical size of the required capacitor.

The present invention, in another of its aspects, relates to novel features of the instrumentalities described herein for teaching the principal object of the invention and to the novel principles employed in the instrumentalities whether or not these features and principles may be used in the said object and/or in the said field.

Other objects of the invention and the nature thereof will become apparent from the following description considered in conjunction with the accompanying drawings and wherein like reference numbers describe elements of similar function therein and wherein the scope of the invention is determined rather from the dependent claims.

For illustrative purposes, the invention will be described in conjunction with the accompanying drawings in which:

The drawing is a schematic of the sawtooth generator circuit of the present invention.

Generally speaking, the present invention is a sawtooth generator circuit comprising: a voltage source; first and second transistors having emitter, base, and collector electrodes; first circuit means for connecting said base electrode of said first transistor to said voltage source so as to provide a constant biasing voltage to said first transistor; second circuit means having a predetermined resistance for connecting said emitter electrode of said first transistor to ground; a capacitor coupled between said collector electrode of said first transistor and ground; third circuit means for connecting said capacitor to the emitter-collector circuit for said second transistor; fourth circuit means for connecting said emitter-collector circuit of said second transistor to said voltage source; a Schmitt trigger for turning on said second transistor when said capacitor is discharged to a predetermined level by said first transistor, thereby charging said capacitor to the potential of said voltage source, said Schmitt trigger being connected to said base of said second transistor, and fifth circuit means for connecting said capacitor to said Schmitt trigger.

Referring now to the drawing, and particularly to the schematic of the drawing, the components and circuitry of the present invention can be visualized in conjunction with the following description.

The positive voltage supply is provided at the terminal 10. The terminal 11 is connected to ground. The resistor 12 and the diodes 13 and 14 are connected in series across the terminals 10 and 11. The emitter of the transistor 15 is connected to the terminal 10 and the collector of the transistor 15 is connected to the collector of the transistor 16. The base of the transistor 16 is connected to a junction between the resistor 12 and the diode 13 and the emitter of said transistor is connected through the resistor 17 to ground.

The collectors of the transistors 15 and 16 are connected to a first side of the capacitor 19 and to the base of the transistor 22. A reference terminal 18 is connected to the collectors of the transistors 15 and 16, the first side of the capacitor 19, and the base of the transistor 22. The collector of the transistor 22 is connected through the resistor 23 to the positive voltage terminal 10 and to the base of the transistor 24. The collector of the transistor 24 is connected back to the base of the transistor 15. The emitters of the transistors 22 and 24 are connected to the collector of the transistor 21. The emitter of the transistor 21 is connected through the resistor 20 to the ground terminal 11. The base of the transistor 21 is connected to the junction between the resistor 12 and the diode 13 and the base of the transistor 16.

The transistors 16 and 21 are connected in the well-known constant current configuration.

With the above description of circuitry in mind, and by making reference to the drawing, the following analysis of operation will serve to convey the functional details of the present invention.

The bases of the transistors 16 and 21 are biased at a constant voltage produced by the network consisting of the resistor 12 and the diodes 13 and 14.

The transistor 16 discharges the capacitor 19 with a constant current. Therefore, the voltage at the terminal 18 reduces linearly with time. As soon as the voltage at the terminal 18 reaches a predetermined minimum level, the Schmitt trigger circuit, consisting of the transistors 22 and 24 and the resistor 23, turns on the transistor 15 and the voltage at the terminal 18 returns to the potential provided at the terminal 10, the Schmitt trigger circuit turns off the transistor 15 and the voltage at the terminal 18 starts dropping linearly again.

The Schmitt trigger circuit controls the magnitude of the sawtooth waveform. The upper trigger level is exactly the voltage obtainable at the terminal 18. Therefore, the waveform has a fixed reference level. The lower trigger level is determined by the value of the resistor 23 and the constant current of the transistor 21.

By connecting the transistors 16, 22, 24 and 15 in succession, a capacitance multiplication effect is created. It has been found that in some instances the capacitor 19 can be eliminated entirely without affecting the waveform. This is due to the fact that the collector and emitter capacitances of the transistors 16, 22, 24 and 15 are multiplied by the current amplification factors of the four transistors. This capacitance multiplication effect is advantageous since large value capacitors are difficult to obtain with integrated circuit manufacturing techniques.

The sawtooth generator of the present invention, as hereinbefore described in one of its embodiments is merely illustrative and not exhaustive in scope. Since many widely different embodiments of the present invention can be made without departing from the scope thereof, it is intended that all matter contained in the above description and shown in the accompanying drawing shall be interposed as illustrative and not in a limiting sense.

What is claimed is:

1. A sawtooth generator circuit comprising: a voltage source; first and second transistors having emitter, base, and collector electrodes; first circuit means for connecting said base electrode of said first transistor to said voltage source so as to provide a constant biasing voltage to said first transistor; second circuit means having a predetermined resistance for connecting said emitter electrode of said first transistor to ground; a capacitor coupled between said collector electrode of said first transistor and ground; third circuit means for connecting said capacitor to the emitter-collector circuit of said second transistor; fourth circuit means for connecting said emitter-collector circuit of said second transistor to said voltage source; a Schmitt trigger for turning on said second transistor when said capacitor is discharged to a predetermined level by said first transistor, thereby charging said capacitor to the potential of said voltage source, said Schmitt trigger being connected to said base of said second transistor, and fifth circuit means for connecting said capacitor to said Schmitt trigger.

2. A sawtooth generator circuit as in claim 1 wherein said voltage source is a positive voltage source and said first transistor is a NPN transistor.

3. A sawtooth generator circuit as in claim 2 wherein said second transistor is a PNP transistor.

4. A sawtooth generator as in claim 1 wherein there is a constant current network for determining the lower triggering level of said Schmitt trigger, said network being connected to ground and in circuit with said Schmitt trigger.

5. A sawtooth generator circuit comprising: a voltage source; first and second transistors each having a base and an emitter-collector circuit, said bases of said first and second transistors being connected to said voltage source so as to constantly bias said first and second transistors on; a first resistor for connecting said emitter-collector circuit of said first transistor to ground; a capacitor coupled across said emitter-collector circuit of said first transistor and said first resistor; a third transistor having an emitter-collector circuit connected to said voltage source and to said capacitor; a Schmitt trigger for turning on said third transistor when said capacitor is discharged to a predetermined level by said emitter-collector circuit of said first transistor, said Schmitt trigger being connected to said third transistor and to said capacitor; and a second resistor for connecting said emitter-collector circuit of said second transistor to ground, said emitter-collector of said second transistor being connected in circuit with said Schmitt trigger so as to maintain said predetermined level at which said Schmitt trigger will turn on said third transistor.

6. A sawtooth generator as in claim 5 wherein said emitter-collector circuit of said third transistor connects said capacitor directly to said voltage source, thereby accurately determining the maximum level of said sawtooth generator output.

7. A sawtooth generator circuit as in claim 5 wherein said Schmitt trigger includes a pair of transistors connected in succession with said first transistor and said third transistor so as to multiply the capacitance effect of said capacitor.

References Cited

UNITED STATES PATENTS

| | | | |
|---|---|---|---|
| 3,156,875 | 11/1964 | Fiorino et al. | 331—111 |
| 3,289,103 | 11/1966 | Campman | 331—111 |

ROY LAKE, *Primary Exaimner.*

S. H. GRIMM, *Assistant Examiner.*